(12) United States Patent
Yoon

(10) Patent No.: US 11,558,060 B2
(45) Date of Patent: Jan. 17, 2023

(54) RATIOMETRIC ANALOG-TO-DIGITAL CONVERSION CIRCUIT

(71) Applicant: Silicon Works Co., Ltd., Daejeon (KR)

(72) Inventor: Jang Hyun Yoon, Daejeon (KR)

(73) Assignee: Silicon Works Co., Ltd, Daejeon (KR)

( * ) Notice: Subject to any disclaimer, the term of this patent is extended or adjusted under 35 U.S.C. 154(b) by 0 days.

(21) Appl. No.: 17/405,492

(22) Filed: Aug. 18, 2021

(65) Prior Publication Data

US 2022/0060194 A1   Feb. 24, 2022

(30) Foreign Application Priority Data

Aug. 20, 2020   (KR) .................. 10-2020-0104785

(51) Int. Cl.
*H03M 1/12* (2006.01)
*H03M 1/06* (2006.01)
*H03M 1/46* (2006.01)

(52) U.S. Cl.
CPC ......... *H03M 1/0619* (2013.01); *H03M 1/468* (2013.01)

(58) Field of Classification Search
CPC ...... H03M 1/12; H03M 1/0607; H03M 1/468; H03M 1/0678; H03M 1/38; H03M 1/46; H03M 1/00; H03M 1/06; H03M 1/0617; H03M 1/0619; H03M 1/0682; H03M 1/1009; H03M 1/1014; H03M 1/1019; H03M 1/1023; H03M 1/1061; H03M 1/1071; H03M 1/1076; H03M 1/122; H03M 1/1245; H03M 1/1295; H03M 1/167; H03M 1/48; H03M 1/804; H03M 11/24; H03M 3/32; H03M 3/43; H03M 3/456; H03M 3/496

USPC ......................................... 341/155, 139, 140
See application file for complete search history.

(56) References Cited

U.S. PATENT DOCUMENTS

| | | | | |
|---|---|---|---|---|
| 8,604,961 | B1* | 12/2013 | Bogner | H03M 1/0619 341/118 |
| 8,766,833 | B1* | 7/2014 | Bogner | H03M 1/1014 341/120 |
| 8,933,830 | B1* | 1/2015 | Jeon | H03M 1/1071 341/110 |
| 9,584,150 | B2* | 2/2017 | Bogner | H03M 1/1009 |
| 9,899,922 | B1* | 2/2018 | Remple | G06F 1/26 |
| 10,156,596 | B2* | 12/2018 | Kumar | G01R 19/257 |
| 10,432,213 | B1* | 10/2019 | Aboudina | H03M 1/468 |
| 11,368,162 | B2* | 6/2022 | Minotani | G01R 19/00 |
| 2005/0190093 | A1* | 9/2005 | Mayer | H03M 3/32 341/155 |

(Continued)

FOREIGN PATENT DOCUMENTS

JP  2015-000008 A  12/2015
KR  10-2244196 B1  4/2021

*Primary Examiner* — Linh V Nguyen
(74) *Attorney, Agent, or Firm* — Polsinelli PC

(57) ABSTRACT

A ratiometric analog-to-digital conversion circuit includes a first voltage range operation circuit configured to use a first power supply voltage of a first voltage range, and output an analog signal corresponding to an external input signal; and a second voltage range operation circuit configured to use a second power supply voltage of a second voltage range, generate a digital value by analog-to-digital converting the analog signal, feed back the digital value for analog-to-digital conversion, and output a digital signal corresponding to the digital value and proportional to the input signal.

15 Claims, 2 Drawing Sheets

(56) References Cited

U.S. PATENT DOCUMENTS

| | | | |
|---|---|---|---|
| 2006/0244647 A1* | 11/2006 | Takano | H03M 1/804 341/144 |
| 2012/0112938 A1* | 5/2012 | Haneda | H03M 1/1019 341/110 |
| 2013/0201042 A1* | 8/2013 | Lan | H03M 1/1061 341/120 |
| 2021/0075987 A1* | 3/2021 | Tani | H03M 1/182 |

* cited by examiner

RATIOMETRIC ANALOG-TO-DIGITAL CONVERSION CIRCUIT

BACKGROUND

1. Technical Field

Various embodiments generally relate to an analog-to-digital conversion circuit, and more particularly, to a ratiometric analog-to-digital conversion circuit which outputs a digital signal of a second voltage range in response to an analog signal as an input signal of a first voltage range.

2. Related Art

In general, a home appliance is configured to perform electronic control so as to provide various functions, and may include a micro control unit for the electronic control.

The micro control unit is configured to electrically interface with various external components and perform necessary control. For example, the micro control unit may be configured to receive an analog input signal from an external signal source such as a sensor, generate a digital signal for the input signal, and implement necessary control using the digital signal.

The micro control unit may be designed to include an analog-to-digital converter (hereinafter, referred to as "ADC"), in order to convert an analog input signal into a digital signal.

In the micro control unit, the ADC may be configured by an integral ADC, a sigma-delta ADC, a successive approximation register (SAR) ADC, etc. in consideration of use, resolution, speed, accuracy and so on.

For instance, the SAR ADC may include a high voltage range circuit which receives an input signal as an analog signal of a high voltage range and a low voltage range circuit which outputs a digital signal of a low voltage range. The high voltage range may be exemplified as a range of 0V to 5V, and the low voltage range may be exemplified as a range of 0V to 1.2V.

The high voltage range circuit may include an input circuit which receives an external input signal through a signal input terminal, a reference voltage providing circuit which receives an external reference voltage through a voltage input terminal, and an SAR analog part which provides a comparison value as a result of comparing the input signal and a sampling voltage.

The low voltage range circuit may include an SAR digital part which converts the comparison value of the SAR analog part into a digital value, and a digital output circuit which outputs a digital signal corresponding to the digital value.

The high voltage range circuit may be operated using a power supply voltage of 5V, and the low voltage range circuit may be operated using a power supply voltage of 1.2V.

The SAR ADC described above needs to feed back the digital value of the SAR digital part of the low voltage range circuit to the SAR analog part of the high voltage range circuit. The SAR ADC needs to include a level shifter which performs the level conversion of a signal in order to transfer the signal between the different voltage ranges. In more detail, the level shifter may be configured to convert the digital value of the low voltage range of the SAR digital part to have a level of the high voltage range and transfer the converted level to the SAR analog part. The level shifter may be configured in the high voltage range circuit.

The SAR ADC may be designed in the micro control unit which is fabricated as a chip. However, since the SAR ADC needs to include the level shifter as described above, the SAR ADC requires a large area in design, which acts as a cause of increasing a chip area.

Further, since the SAR ADC is required to transfer a signal between the different voltage ranges through the level shifter, the SAR ADC has a limitation in implementing a high-speed operation.

Moreover, when outputting the digital signal of the low voltage range in correspondence to the input signal of the high voltage range, the SAR ADC needs to maintain the accuracy of a ratiometric conversion in consideration of a level of the reference voltage.

SUMMARY

Various embodiments are directed to providing a ratiometric analog-to-digital conversion circuit capable of realizing a high-speed operation while reducing a design area.

Also, various embodiments are directed to providing a ratiometric analog-to-digital conversion circuit capable of improving the accuracy of a ratiometric conversion by compensating for a conversion error due to the use of a reference voltage of a low level.

In an embodiment, a ratiometric analog-to-digital conversion circuit may include: a first voltage range operation circuit configured to use a first power supply voltage of a first voltage range, and output an analog signal corresponding to an external input signal; and a second voltage range operation circuit configured to use a second power supply voltage of a second voltage range, generate a digital value by analog-to-digital converting the analog signal, feed back the digital value for analog-to-digital conversion, and output a digital signal corresponding to the digital value and proportional to the input signal, wherein the second voltage range is smaller than the first voltage range, and wherein the second power supply voltage has a level lower than that of the first power supply voltage.

In an embodiment, a ratiometric analog-to-digital conversion circuit may include: a first voltage range operation circuit configured to use a first power supply voltage of a first voltage range, and output an analog signal corresponding to an external input signal; and second voltage range operation circuit configured to use a second power supply voltage of a second voltage range, generate a digital value by analog-to-digital converting the analog signal, feed back the digital value for analog-to-digital conversion, generate a count result by counting the digital value, and output a digital signal proportional to the input signal, by combining the count result and monitoring information, wherein the second voltage range is smaller than the first voltage range, wherein the second power supply voltage has a level lower than that of the first power supply voltage, and wherein the monitoring information is provided to have a proportional value of the first power supply voltage and the second power supply voltage.

The ratiometric analog-to-digital conversion circuit according to the embodiments of the present disclosure is configured to output a digital signal of a second voltage range in response to an input signal of a first voltage range and implement a feedback for an analog-to-digital conversion within the second voltage range.

Therefore, the ratiometric analog-to-digital conversion circuit according to the embodiments of the present disclosure does not require the configuration of a component for a level conversion, such as a level shifter, and as a result, has an advantage of being capable of reducing a design area and realizing a high-speed operation.

Also, the ratiometric analog-to-digital conversion circuit according to the embodiments of the present disclosure is configured to use a reference voltage of a low level that falls within the second voltage range in which an analog-to-digital conversion is performed.

Therefore, the ratiometric analog-to-digital conversion circuit according to the embodiments of the present disclosure compensates for a conversion error by the reference voltage of a low level, by using monitoring information having a proportional value of a first power supply voltage of the first voltage range and a second power supply voltage of the second voltage range.

Thus, the ratiometric analog-to-digital conversion circuit according to the embodiments of the present disclosure may have improved accuracy for an input and output proportional conversion, through the compensation for a conversion error, by the monitoring information.

DETAILED DESCRIPTION

The present disclosure discloses a ratiometric analog-to-digital conversion circuit.

The ratiometric analog-to-digital conversion circuit of the present disclosure is to receive an input signal as an analog signal and output a digital signal generated by analog-to-digital converting the input signal. The digital signal is outputted to have a value proportional to the input signal.

The ratiometric analog-to-digital conversion circuit of the present disclosure may be designed inside a micro control unit (not illustrated) which is fabricated as a chip, or may be designed to be fabricated as a separate chip.

The ratiometric analog-to-digital conversion circuit of the present disclosure may be configured to receive an input signal through a signal input terminal of a chip, and provide a digital signal, generated by an analog-to-digital conversion, to an internal component thereof or to an external component through a signal output terminal.

The ratiometric analog-to-digital conversion circuit of the present disclosure may be implemented to include a high voltage range circuit which receives an input signal as an analog signal of a high voltage range and a low voltage range circuit which outputs a digital signal of a low voltage range.

Figure 1:
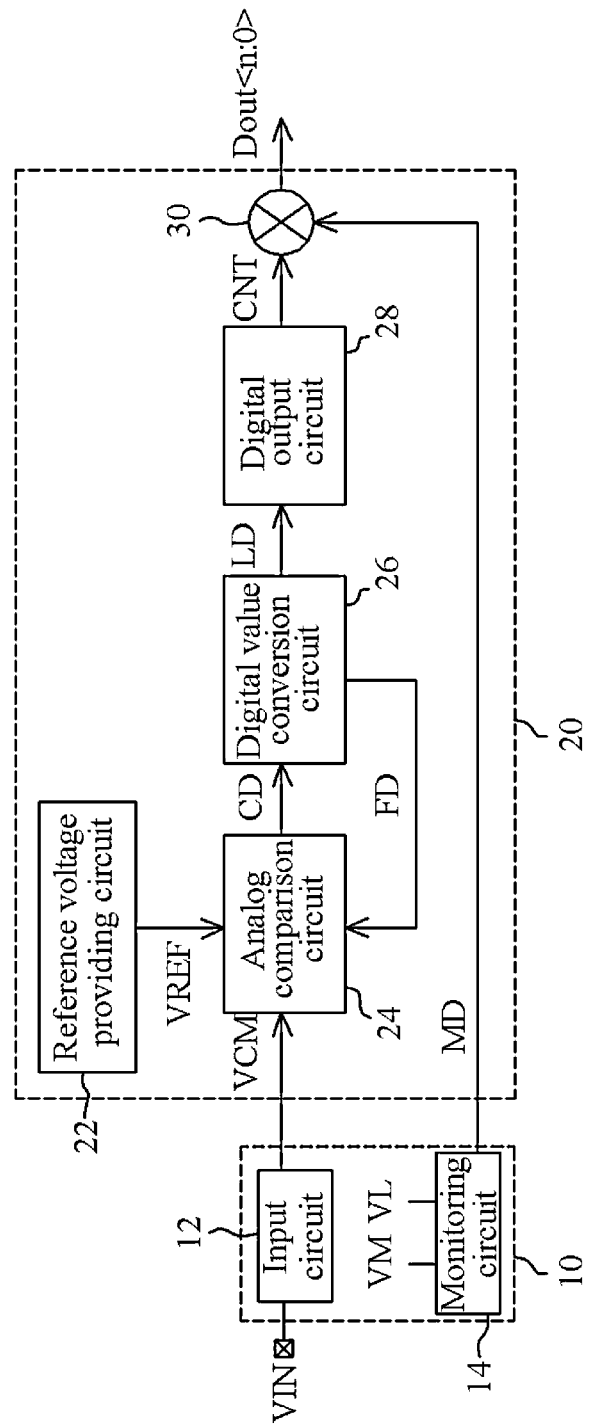
FIG. 1 is a block diagram illustrating a ratiometric analog-to-digital conversion circuit in accordance with an embodiment of the present disclosure.

An embodiment of the present disclosure described above may be configured as a ratiometric SAR ADC of FIG. 1. The ratiometric SAR ADC means that the ratiometric analog-to-digital conversion circuit described above converts an input signal into a digital signal in a successive approximation scheme using a proportional value.

In the embodiment of the present disclosure illustrated in FIG. 1, a first voltage range may be exemplified as a range of 0V to 5V, and a second voltage range may be exemplified as a range of 0V to 1.2V. The first voltage range may be understood as a high voltage range, and the second voltage range may be understood as a low voltage range. A first power supply voltage of the first voltage range may be understood as having 5V, and a second power supply voltage of the second voltage range may be understood as having 1.2V. That is to say, the second voltage range is smaller than the first voltage range, and the second power supply voltage has a level lower than that of the first power supply voltage. In FIG. 1, the first power supply voltage is denoted by "VM," and the second power supply voltage is denoted by "VL."

The embodiment of FIG. 1 includes a first voltage range operation circuit 10 and a second voltage range operation circuit 20.

It may be understood that the first voltage range operation circuit 10 and the second voltage range operation circuit 20 are circuits configured in one chip and are identified depending on a level of a power supply voltage used therein.

The first voltage range operation circuit 10 uses the first power supply voltage VM of the first voltage range, and is configured to output an analog signal VCM corresponding to an external input signal VIN. The input signal VIN may be inputted from the outside through an input signal terminal, and has an analog level.

The first voltage range operation circuit 10 may include an input circuit 12 which receives the input signal VIN using the first power supply voltage VM. FIG. 1 does not illustrate the application of the first power supply voltage VM to the input circuit 12.

It may be understood that the input circuit 12 includes, therein, an amplifier (not illustrated) having a preset amplification gain. The amplifier may be configured to receive the input signal VIN using the first power supply voltage VM and output the analog signal VCM which has a reduced level to have a level of the second voltage range according to the amplification gain. The amplifier may be easily implemented by those who understand the technology of the present disclosure, and thus, the illustration of a detailed circuit thereof will be omitted.

In other words, the input circuit 12 is configured to receive the input signal VIN using the first power supply voltage VM, and output the analog signal VCM which has a level included in the second voltage range by the preset amplification gain.

The first voltage range operation circuit 10 may further include a monitoring circuit 14. The monitoring circuit 14 may be configured in the second voltage range operation circuit 20, if necessary, according to a fabricator's intention.

The monitoring circuit 14 is configured to receive the first power supply voltage VM and the second power supply voltage VL, and output monitoring information MD corresponding to a proportional value of the first power supply voltage VM and the second power supply voltage VL.

In more detail, the monitoring circuit 14 may be configured to generate a proportional value by dividing the second power supply voltage VL by the first power supply voltage VM, and output the monitoring information MD which is obtained by converting the proportional value into a digital value of the second voltage range. It may be understood that the monitoring circuit 14 includes a conversion circuit for converting the proportional value into the digital value.

When converting the proportional value into the monitoring information MD having the digital value, the monitoring circuit 14 may generate the monitoring information MD such that the monitoring information MD has the same number of bits as a count result CNT of a digital output circuit 28 of the second voltage range operation circuit 20 which will be described later.

While the first voltage range operation circuit 10 may include, in addition to the input circuit 12 and the monitoring circuit 14, input terminals for receiving signals or voltages inputted from the outside and interface circuits connected thereto, detailed illustration and description thereof will be omitted.

The second voltage range operation circuit 20 is configured to receive the analog signal VCM of the first voltage range operation circuit 10 and output a digital signal Dout<n:0> proportional to the input signal VIN.

The second voltage range operation circuit 20 is configured to operate using the second power supply voltage VL of the second voltage range, generate a digital value LD by analog-to-digital converting the analog signal VCM, feed back the digital value LD for analog-to-digital conversion, and output the digital signal Dout<n:0> corresponding to the digital value LD and proportional to the input signal VIN.

In more detail, the second voltage range operation circuit 20 is configured to generate the count result CNT by counting the digital value LD, and output the digital signal Dout<n:0> proportional to the input signal VIN, by combining the count result CNT and the monitoring information MD.

To this end, the second voltage range operation circuit 20 may be configured to include a reference voltage providing circuit 22, an analog comparison circuit 24, a digital value conversion circuit 26, the digital output circuit 28 and a calculation circuit 30. These components of the second voltage range operation circuit 20 are configured to be operated using the second power supply voltage VL and have inputs and outputs of levels included in the second voltage range. For the sake of convenience in explanation, the illustration of the application of the second power supply voltage VL to the reference voltage providing circuit 22, the analog comparison circuit 24, the digital value conversion circuit 26, the digital output circuit 28 and the calculation circuit 30 is omitted.

The reference voltage providing circuit 22 is configured to generate a reference voltage VREF which has a level of the second voltage range, by using an external input voltage or an internal voltage.

To this end, it may be understood that the reference voltage providing circuit 22 includes an amplifier (not illustrated) therein. The amplifier may be configured to output the reference voltage VREF, as a constant voltage included in the second voltage range, in correspondence to the external input voltage or the internal voltage by using the second power supply voltage VL. The amplifier may be easily implemented by those who understand the technology of the present disclosure, and thus, the illustration of a detailed circuit thereof will be omitted.

The analog comparison circuit 24 corresponds to an analog part of the SAR ADC.

The analog comparison circuit 24 is configured to select the reference voltage VREF or a ground voltage GND by a feedback signal FD, compare a sampling voltage whose level is changed by the selected reference voltage VREF or ground voltage GND with the analog signal VCM, and provide a comparison result as a comparison value CD.

The digital value conversion circuit 26 corresponds to a digital part of the SAR ADC.

The digital value conversion circuit 26 is configured to generate the digital value LD by converting the comparison value CD, provide the digital value LD as the feedback signal FD, and output the digital value LD for counting.

The configurations and operations of the analog comparison circuit 24 and the digital value conversion circuit 26 will be described below in detail with reference to FIGS. 2 and 3.

Figure 2:
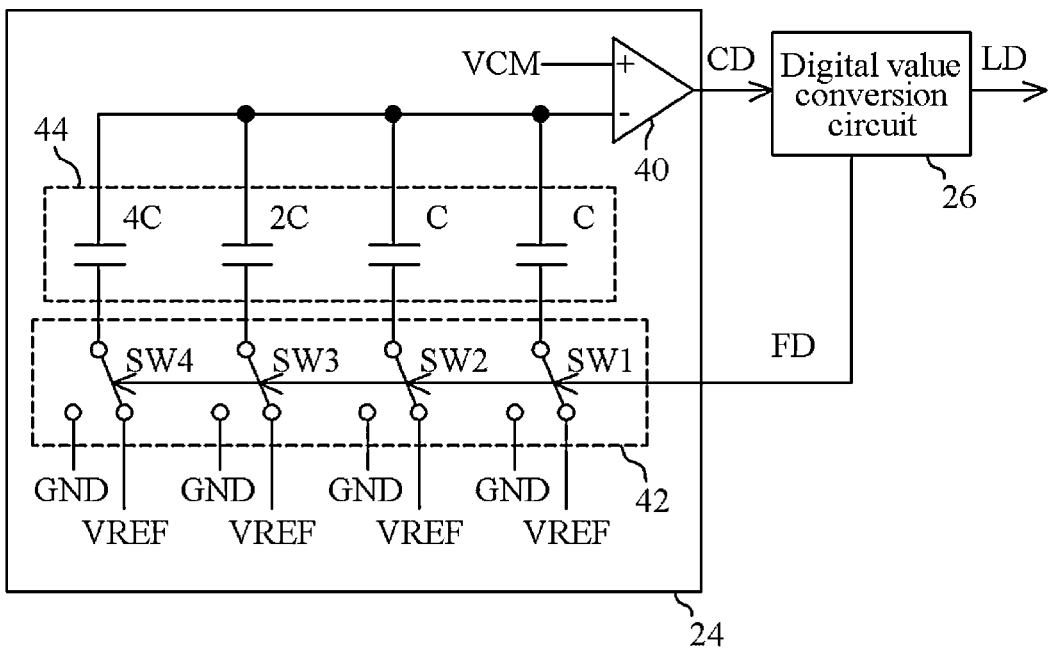
FIG. 2 is a detailed circuit diagram illustrating an analog comparison circuit, which selects a reference voltage, and a digital value conversion circuit of FIG. 1.
Figure 3:
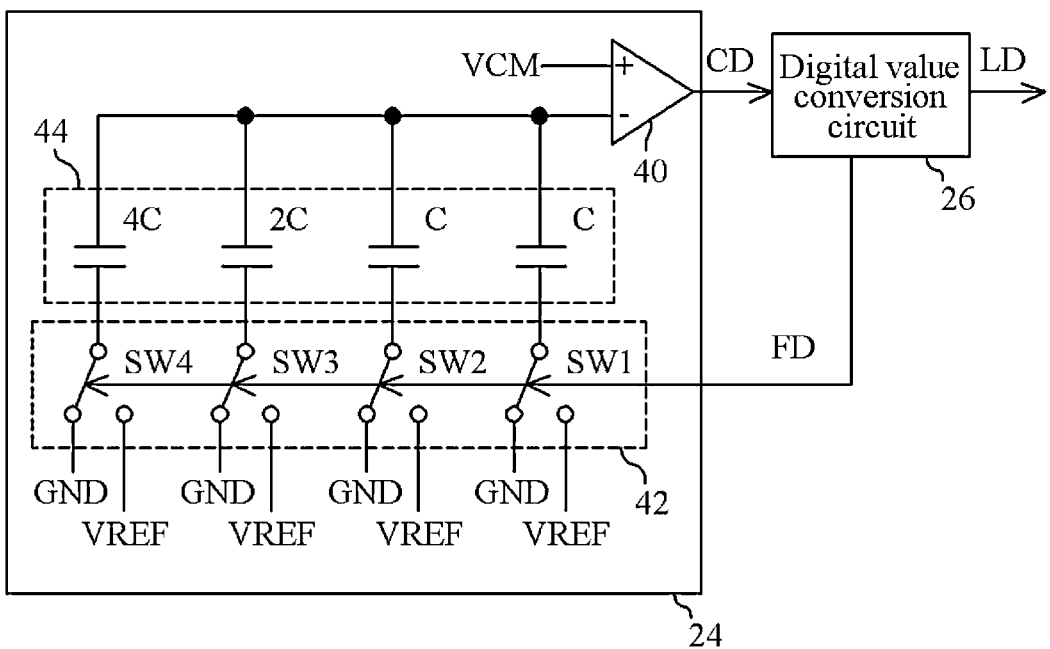
FIG. 3 is a detailed circuit diagram illustrating the analog comparison circuit, which selects a ground voltage, and the digital value conversion circuit of FIG. 1.

Referring to FIGS. 2 and 3, the analog comparison circuit 24 is configured to include a comparator 40, a selection circuit 42 and a sampling circuit 44.

The comparator 40 is configured to compare the analog signal VCM applied to a first input terminal and a sampling voltage applied to a second input terminal, and output the comparison value CD, as a comparison result, through an output terminal. The first input terminal may be understood as a positive input terminal of the comparator 40, and the second input terminal may be understood as a negative input terminal of the comparator 40.

The comparator 40 may output a positive comparison value CD when the analog signal VCM is higher than the sampling voltage, and may output a negative comparison value CD when the analog signal VCM is lower than the sampling voltage.

The sampling circuit 44 may include a plurality of capacitors which are connected in parallel to the second input terminal, that is, the negative input terminal, of the comparator 40. For example, the sampling circuit 44 may include four parallel capacitors, and the four parallel capacitors may have the same or different capacitances. FIGS. 2 and 3 illustrate that the capacitors of the sampling circuit 44 have capacitances of "C," "C," "2C" and "4C," respectively. "C" may be understood as a unit capacitance which may be set by a fabricator.

The selection circuit 42 is configured to select the reference voltage VREF or the ground voltage GND by the feedback signal FD which has a level of the second voltage range. In more detail, the selection circuit 42 includes switches SW1, SW2, SW3 and SW4 which are connected to the capacitors, respectively. Each of the switches SW1, SW2, SW3 and SW4 is configured to select one of the reference voltage VREF and the ground voltage GND by the feedback signal FD and apply the selected voltage to one end of a capacitor connected thereto.

The sampling circuit 44 is configured between the second input terminal of the comparator 40 and the selection circuit 42. Although not illustrated in detail, each capacitor of the sampling circuit 44 samples a voltage by the second power supply voltage VL. It may be understood that the sampling circuit 44 applies a sampling voltage by the parallel capacitors to the second input terminal of the comparator 40.

The sampling voltage of the sampling circuit 44 may be changed in response to a voltage selected by the selection circuit 42.

When the switches SW1, SW2, SW3 and SW4 of the selection circuit 42 select the reference voltage VREF, each of the capacitors of the sampling circuit 44 samples a voltage corresponding to a potential difference between the second power supply voltage VL and the reference voltage VREF at both ends thereof. When the switches SW1, SW2, SW3 and SW4 of the selection circuit 42 select the ground voltage GND, each of the capacitors of the sampling circuit 44 samples a voltage corresponding to a potential difference between the second power supply voltage VL and the ground voltage GND at both ends thereof. The switches SW1, SW2, SW3 and SW4 are controlled to simultaneously select the reference voltage VREF or simultaneously select the ground voltage GND. As a result, the selection circuit 42 may select the reference voltage VREF or select the ground voltage GND.

The potential difference between the second power supply voltage VL and the ground voltage GND is larger than the potential difference between the second power supply voltage VL and the reference voltage VREF. Therefore, the sampling circuit 44 may provide a low sampling voltage when the selection circuit 42 selects the reference voltage VREF, and may provide a high sampling voltage when the selection circuit 42 selects the ground voltage GND.

Namely, the sampling circuit 44 applies a sampling voltage whose level is determined by the reference voltage VREF or the ground voltage GND selected by the selection circuit 42, to the second input terminal of the comparator 40.

FIG. 2 illustrates a case in which the selection circuit 42 selects the reference voltage VREF, and FIG. 3 illustrates a case in which the selection circuit 42 selects the ground voltage GND. In FIGS. 2 and 3, only switching states of the selection circuit 42 are different and the other configurations are the same, and thus, repeated description thereof will be omitted.

The digital value conversion circuit 26 receives the comparison value CD outputted from the comparator 40 as described above, generates the digital value LD of 1 bit corresponding to a level of the comparison value CD, and provides the digital value LD to the digital output circuit 28 for counting.

For example, when the analog signal VCM is equal to or higher than a sampling voltage and thus a positive comparison value CD is received from the comparator 40, the digital value conversion circuit 26 generates the digital value LD corresponding to a logic high. When the analog signal VCM is lower than a sampling voltage and thus a negative comparison value CD is received from the comparator 40, the digital value conversion circuit 26 generates the digital value LD corresponding to a logic low.

The digital value conversion circuit 26 provides the digital value LD as the feedback signal FD to the selection circuit 42. The feedback signal FD of the digital value conversion circuit 26 is used to control the switching state of the selection circuit 42 as described above.

In more detail, each of the switches SW1, SW2, SW3 and SW4 of the selection circuit 42 may select the reference voltage VREF when the feedback signal FD of a logic high is received, and may select the ground voltage GND when the feedback signal FD of a logic low is received.

The digital output circuit 28 of FIG. 1 is configured to receive the digital value LD, count the digital value LD, and output the count result CNT. For example, the digital output circuit 28 may output the count result CNT which is proportional to the input signal VIN, by cumulatively counting the digital value LD using a clock.

The calculation circuit 30 may output the digital signal Dout<n:0> by combining the count result CNT and the monitoring information MD. The calculation circuit 30 may be configured to include a multiplier which multiplies the count result CNT and the monitoring information MD.

The SAR ADC in accordance with the embodiment of the present disclosure uses the reference voltage VREF having a level of the second voltage range as the low voltage range, when outputting the digital signal Dout<n:0> of the second voltage range as the low voltage range in response to the input signal VIN of the first voltage range as the high voltage range.

A change in the reference voltage VREF having a level of the second voltage range as the low voltage range is smaller than a change in the first power supply voltage VM of the first voltage range as the high voltage range. Therefore, due to a difference between the changes, it is difficult for the digital signal Dout<n:0> generated by converting the input signal VIN to maintain the accuracy of a ratiometric conversion.

In order to solve this problem, the embodiment of the present disclosure includes the monitoring circuit 14 and the calculation circuit 30.

As described above, the monitoring circuit 14 outputs the monitoring information MD corresponding to a proportional value of the first power supply voltage VM and the second power supply voltage VL, and the calculation circuit 30 digitally multiplies the count result CNT and the monitoring information MD by a multiplier and outputs the digital signal Dout<n:0> as a multiplied result.

The count result CNT of the digital output circuit 28 does not have a value which reflects a difference between a change in the reference voltage VREF having a level of the second voltage range as the low voltage range and a change in the first power supply voltage VM of the first voltage range as the high voltage range.

Therefore, a difference between a change in the reference voltage VREF having a level of the second voltage range as the low voltage range and a change in the first power supply voltage VM of the first voltage range as the high voltage range needs to be compensated for.

As described above, the monitoring information MD has a proportional value obtained by dividing the second power supply voltage VL by the first power supply voltage VM. Therefore, by multiplying the count result CNT by the monitoring information MD, the digital signal Dout<n:0>, which compensates for a difference between a change in the reference voltage VREF having a level of the second voltage range as the low voltage range and a change in the first power supply voltage VM of the first voltage range as the high voltage range, may be generated.

The embodiment of the present disclosure configured as illustrated in FIGS. 1 to 3 operates to output the digital signal Dout<n:0> of the second voltage range corresponding to the input signal VIN of the first voltage range by a ratiometric conversion.

In more detail, the analog comparison circuit 24 compares a sampling voltage, sampled by the reference voltage VREF or the ground voltage GND selected by the feedback signal FD, with the analog signal VCM of the second voltage range corresponding to the input signal VIN of the first voltage range, and outputs the comparison value CD as a comparison result.

The digital value conversion circuit 26 converts the comparison value CD into the digital value LD, and provides the digital value LD to the digital output circuit 28.

When the analog signal VCM is higher than the sampling voltage, the analog comparison circuit 24 outputs a positive comparison value CD, and the digital value conversion circuit 26 provides the digital value LD and feedback signal FD of a logic high. Conversely, when the analog signal VCM is lower than the sampling voltage, the analog comparison circuit 24 outputs a negative comparison value CD, and the digital value conversion circuit 26 provides the digital value LD and feedback signal FD of a logic low.

When the feedback signal FD of a logic high is provided, the analog comparison circuit 24 increases a sampling voltage by selecting the ground voltage GND, and outputs the comparison value CD obtained by comparing an increased sampling voltage and the analog signal VCM. Conversely, when the feedback signal FD of a logic low is provided, the analog comparison circuit 24 decreases a sampling voltage by selecting the reference voltage VREF, and outputs the comparison value CD obtained by comparing a decreased sampling voltage and the analog signal VCM.

The digital value conversion circuit 26 receives the comparison value CD of the analog comparison circuit 24 and provides the digital value LD corresponding to the comparison value CD, and the digital output circuit 28 performs a count operation using the digital value LD provided as a logic high or a logic low and provides the count result CNT as a result of the count operation.

The calculation circuit 30 digitally multiplies the count result CNT and the monitoring information MD to compensate the count result CNT for a difference between a change in the reference voltage VREF and a change in the first power supply voltage VM, and outputs the digital signal Dout<n:0> as a result of the digital multiplication.

The above-described embodiment of the present disclosure is configured such that a feedback for an analog-to-digital conversion is performed within the second voltage range. That is to say, the digital value conversion circuit 26 provides the feedback signal FD of the second voltage range, and the analog comparison circuit 24 receives the feedback signal FD of the second voltage range.

The ratiometric analog-to-digital conversion circuit according to the embodiments of the present disclosure is configured to transfer a feedback signal of the same voltage range between an SAR digital part and an SAR analog part for an analog-to-digital conversion. Therefore, a level shifting for signal transfer between the SAR digital part and the SAR analog part is unnecessary.

Therefore, the ratiometric analog-to-digital conversion circuit according to the embodiments of the present disclosure does not require the configuration of a component such as a level shifter for signal transfer between the SAR digital part and the SAR analog part, and thus, may have an advantage of being capable of reducing a design area and realizing a high-speed operation.

Also, the ratiometric analog-to-digital conversion circuit according to the embodiments of the present disclosure is configured to use a reference voltage of a low level that falls within a second voltage range in which an analog-to-digital conversion is performed.

The ratiometric analog-to-digital conversion circuit according to the embodiments of the present disclosure may output a digital signal which is compensated by using monitoring information having a proportional value of a first power supply voltage of a first voltage range as a high voltage range and a second power supply voltage of the second voltage range as a low voltage range in which the reference voltage is included.

Thus, the ratiometric analog-to-digital conversion circuit according to the embodiments of the present disclosure provides an advantage of being capable of having improved accuracy for a ratiometric conversion, through compensation for a conversion error, by the monitoring information.

What is claimed is:

1. A ratiometric analog-to-digital conversion circuit comprising:
    a first voltage range operation circuit configured to use a first power supply voltage of a first voltage range, and output an analog signal with a level of a second voltage range by reducing a level of an external input signal of the first voltage range; and
    a second voltage range operation circuit configured to use a second power supply voltage of a second voltage range, generate a digital value by analog-to-digital converting a comparison value, which is compared the analog signal with a sampling voltage whose level is changed by a feedback signal, use the digital value as the feedback signal for analog-to-digital conversion, and output a digital signal corresponding to the digital value and proportional to the input signal,
    wherein the second voltage range is smaller than the first voltage range, and
    wherein the second power supply voltage has a level lower than that of the first power supply voltage.

2. The ratiometric analog-to-digital conversion circuit according to claim 1, wherein
    the first voltage range operation circuit comprises an input circuit, and
    the input circuit receives the input signal using the first power supply voltage, and outputs the analog signal which has a level included in the second voltage range by a preset amplification gain.

3. The ratiometric analog-to-digital conversion circuit according to claim 1, wherein the second voltage range operation circuit comprises:
    a reference voltage providing circuit configured to provide a reference voltage which has a level of the second voltage range;
    an analog comparison circuit configured to select the reference voltage or a ground voltage by the feedback signal, compare the sampling voltage whose level is changed by the selected reference voltage or ground voltage with the analog signal, and provide a comparison result as the comparison value;
    a digital value conversion circuit configured to generate the digital value by converting the comparison value, provide the digital value as the feedback signal, and output the digital value for counting; and
    a digital output circuit configured to count the digital value, and provide a count result for output of the digital signal.

4. The ratiometric analog-to-digital conversion circuit according to claim 3, wherein
    the digital value conversion circuit provides the feedback signal having a level of the second voltage range, and
    the analog comparison circuit receives the feedback signal having a level of the second voltage range.

5. The ratiometric analog-to-digital conversion circuit according to claim 3, wherein the reference voltage providing circuit generates the reference voltage which has a level of the second voltage range, by using an external input voltage or an internal voltage.

6. The ratiometric analog-to-digital conversion circuit according to claim 3, wherein the analog comparison circuit comprises:
    a comparator configured to compare the analog signal applied to a first input terminal and the sampling voltage applied to a second input terminal, and output the comparison value, as a comparison result, through an output terminal;
    a selection circuit configured to select the reference voltage or the ground voltage by the feedback signal which has a level of the second voltage range; and
    a sampling circuit disposed between the second input terminal of the comparator and the selection circuit, and configured to store the sampling voltage and apply the sampling voltage whose level is determined by the reference voltage or the ground voltage selected by the selection circuit, to the second input terminal of the comparator.

7. The ratiometric analog-to-digital conversion circuit according to claim 6, wherein the digital value conversion circuit provides the feedback signal for selecting the ground voltage, in response to the comparison value corresponding to that the analog signal is equal to or higher than the sampling voltage, and the digital value conversion circuit provides the feedback signal for selecting the reference voltage, in response to the comparison value corresponding to that the analog signal is lower than the sampling voltage.

8. The ratiometric analog-to-digital conversion circuit according to claim 3, wherein the digital value conversion circuit provides the feedback signal which selects, between the reference voltage and the ground voltage, one for increasing a level of the sampling voltage, in response to the comparison value corresponding to that the analog signal is equal to or higher than the sampling voltage, and the digital value conversion circuit provides the feedback signal which selects, between the reference voltage and the ground voltage, one for decreasing a level of the sampling voltage, in response to the comparison value corresponding to that the analog signal is lower than the sampling voltage.

9. A ratiometric analog-to-digital conversion circuit comprising:

a first voltage range operation circuit configured to use a first power supply voltage of a first voltage range, and output an analog signal corresponding to an external input signal; and a second voltage range operation circuit configured to use a second power supply voltage of a second voltage range, generate a digital value by analog-to-digital converting the analog signal, feed back the digital value for analog-to-digital conversion, generate a count result by counting the digital value, and output a digital signal proportional to the input signal, by combining the count result and monitoring information, wherein the second voltage range is smaller than the first voltage range, wherein the second power supply voltage has a level lower than that of the first power supply voltage, and wherein the monitoring information is provided to have a proportional value of the first power supply voltage and the second power supply voltage.

10. The ratiometric analog-to-digital conversion circuit according to claim 9, wherein at least one of the first voltage range operation circuit and the second voltage range operation circuit includes a monitoring circuit, and the monitoring circuit outputs the monitoring information which is stored in advance.

11. The ratiometric analog-to-digital conversion circuit according to claim 9, wherein the first voltage range operation circuit comprises a monitoring circuit, and the monitoring circuit receives the first power supply voltage and the second power supply voltage, and outputs the monitoring information corresponding to a proportional value of the first power supply voltage and the second power supply voltage.

12. The ratiometric analog-to-digital conversion circuit according to claim 11, wherein the monitoring circuit generates the proportional value by dividing the second power supply voltage by the first power supply voltage, and outputs the monitoring information which is obtained by converting the proportional value into a digital value of the second voltage range.

13. The ratiometric analog-to-digital conversion circuit according to claim 9, wherein the second voltage range operation circuit comprises:

a reference voltage providing circuit configured to provide a reference voltage which has a level of the second voltage range;

an analog comparison circuit configured to select the reference voltage or a ground voltage by a feedback signal, compare a sampling voltage whose level is changed by the selected reference voltage or ground voltage with the analog signal, and provide a comparison result as a comparison value;

a digital value conversion circuit configured to generate the digital value by converting the comparison value, provide the digital value as the feedback signal, and output the digital value for counting;

a digital output circuit configured to count the digital value, and output the count result; and a calculation circuit configured to output the digital signal by combining the count result and the monitoring information.

14. The ratiometric analog-to-digital conversion circuit according to claim 13, wherein the calculation circuit comprises a multiplier which multiplies the count result and the monitoring information.

15. The ratiometric analog-to-digital conversion circuit according to claim 9, wherein the first voltage range operation circuit comprises a monitoring circuit which outputs the monitoring information corresponding to a proportional value of the first power supply voltage and the second power supply voltage, and the second voltage range operation circuit comprises a multiplier which outputs the digital signal by multiplying the count result and the monitoring information.

* * * * *